(12) United States Patent
Zhan et al.

(10) Patent No.: US 12,166,168 B2
(45) Date of Patent: Dec. 10, 2024

(54) ELECTROLYTE STRUCTURE FOR A HIGH-TEMPERATURE, HIGH-PRESSURE LITHIUM BATTERY

(71) Applicant: Saudi Arabian Oil Company, Dhahran (SA)

(72) Inventors: Guodong Zhan, Dhahran (SA); Timothy E. Moellendick, Dhahran (SA); Abdulwahab S Aljohar, Dhahran (SA); Chinthaka Pasan Gooneratne, Dhahran (SA); Jianhui Xu, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 18/154,393

(22) Filed: Jan. 13, 2023

(65) Prior Publication Data
US 2023/0170521 A1    Jun. 1, 2023

Related U.S. Application Data

(62) Division of application No. 16/890,474, filed on Jun. 2, 2020, now Pat. No. 11,631,884.

(51) Int. Cl.
| | |
|---|---|
| *H01M 10/056* | (2010.01) |
| *H01M 10/0525* | (2010.01) |
| *C23C 16/40* | (2006.01) |
| *C23C 16/455* | (2006.01) |

(52) U.S. Cl.
CPC ..... *H01M 10/056* (2013.01); *H01M 10/0525* (2013.01); *C23C 16/40* (2013.01); *C23C 16/45525* (2013.01); *H01M 2300/0074* (2013.01); *H01M 2300/0082* (2013.01); *H01M 2300/0094* (2013.01)

(58) Field of Classification Search
CPC .......... H01M 10/056; H01M 10/0525; H01M 2300/0074; H01M 2300/0082; H01M 2300/0094; C23C 16/40; C23C 16/45525
See application file for complete search history.

(56) References Cited

U.S. PATENT DOCUMENTS

| | | | |
|---|---|---|---|
| 891,957 | A | 6/1908 | Schubert |
| 2,286,673 | A | 6/1942 | Douglas |
| 2,305,062 | A | 12/1942 | Church et al. |
| 2,344,120 | A | 3/1944 | Baker |

(Continued)

FOREIGN PATENT DOCUMENTS

| | | | | |
|---|---|---|---|---|
| CA | 2669721 | | 7/2011 | |
| CN | 104810549 | * | 7/2015 | ........ H01M 10/0565 |

(Continued)

OTHER PUBLICATIONS

PCT International Search Report and Written Opinion in International Appln. No. PCT/US2021/035117, dated Sep. 24, 2021, 11 pages.

(Continued)

*Primary Examiner* — Helen Oi K Conley
(74) *Attorney, Agent, or Firm* — Fish & Richardson P.C.

(57) ABSTRACT

A system and a method for forming a composite electrolyte structure are provided. An exemplary composite electrolyte structure includes, at least in part, polymer electrolyte preforms that are bonded into the composite electrolyte structure.

16 Claims, 6 Drawing Sheets

(56) References Cited

U.S. PATENT DOCUMENTS

| | | |
|---|---|---|
| 2,757,738 A | 9/1948 | Ritchey |
| 2,509,608 A | 5/1950 | Penfield |
| 2,688,369 A | 9/1954 | Broyles |
| 2,719,363 A | 10/1955 | Richard et al. |
| 2,795,279 A | 6/1957 | Erich |
| 2,799,641 A | 7/1957 | Gordon |
| 2,805,045 A | 9/1957 | Goodwin |
| 2,841,226 A | 7/1958 | Conrad et al. |
| 2,927,775 A | 3/1960 | Hildebrandt |
| 3,016,244 A | 1/1962 | Friedrich et al. |
| 3,028,915 A | 4/1962 | Jennings |
| 3,087,552 A | 4/1963 | Graham |
| 3,102,599 A | 9/1963 | Hillburn |
| 3,103,975 A | 9/1963 | Hanson |
| 3,104,711 A | 9/1963 | Haagensen |
| 3,114,875 A | 12/1963 | Haagensen |
| 3,133,592 A | 5/1964 | Tomberlin |
| 3,137,347 A | 6/1964 | Parker |
| 3,149,672 A | 9/1964 | Joseph et al. |
| 3,169,577 A | 2/1965 | Erich |
| 3,170,519 A | 2/1965 | Haagensen |
| 3,211,220 A | 10/1965 | Erich |
| 3,236,307 A | 2/1966 | Brown |
| 3,268,003 A | 8/1966 | Essary |
| 3,428,125 A | 2/1969 | Parker |
| 3,522,848 A | 8/1970 | New |
| 3,547,192 A | 12/1970 | Claridge et al. |
| 3,547,193 A | 12/1970 | Gill |
| 3,642,066 A | 2/1972 | Gill |
| 3,656,564 A | 4/1972 | Brown |
| 3,696,866 A | 10/1972 | Dryden |
| 3,862,662 A | 1/1975 | Kern |
| 3,874,450 A | 4/1975 | Kern |
| 3,931,856 A | 1/1976 | Barnes |
| 3,946,809 A | 3/1976 | Hagedorn |
| 3,948,319 A | 4/1976 | Pritchett |
| 4,008,762 A | 2/1977 | Fisher et al. |
| 4,010,799 A | 3/1977 | Kern et al. |
| 4,064,211 A | 12/1977 | Wood |
| 4,084,637 A | 4/1978 | Todd |
| 4,135,579 A | 1/1979 | Rowland et al. |
| 4,140,179 A | 2/1979 | Kasevich et al. |
| 4,140,180 A | 2/1979 | Bridges et al. |
| 4,144,935 A | 3/1979 | Bridges et al. |
| 4,191,493 A | 3/1980 | Hansson et al. |
| 4,193,448 A | 3/1980 | Jearnbey |
| 4,193,451 A | 3/1980 | Dauphine |
| 4,196,329 A | 4/1980 | Rowland et al. |
| 4,199,025 A | 4/1980 | Carpenter |
| 4,265,307 A | 5/1981 | Elkins |
| RE30,738 E | 9/1981 | Bridges et al. |
| 4,301,865 A | 11/1981 | Kasevich et al. |
| 4,320,801 A | 3/1982 | Rowland et al. |
| 4,334,928 A | 6/1982 | Hara |
| 4,343,651 A | 8/1982 | Yazu et al. |
| 4,354,559 A | 10/1982 | Johnson |
| 4,373,581 A | 2/1983 | Toellner |
| 4,394,170 A | 7/1983 | Sawaoka et al. |
| 4,396,062 A | 8/1983 | Iskander |
| 4,412,585 A | 11/1983 | Bouck |
| 4,449,585 A | 5/1984 | Bridges et al. |
| 4,457,365 A | 7/1984 | Kasevich et al. |
| 4,470,459 A | 9/1984 | Copland |
| 4,476,926 A | 10/1984 | Bridges et al. |
| 4,484,627 A | 11/1984 | Perkins |
| 4,485,868 A | 12/1984 | Sresty et al. |
| 4,485,869 A | 12/1984 | Sresty et al. |
| 4,487,257 A | 12/1984 | Dauphine |
| 4,495,990 A | 1/1985 | Titus et al. |
| 4,498,535 A | 2/1985 | Bridges |
| 4,499,948 A | 2/1985 | Perkins |
| 4,508,168 A | 4/1985 | Heeren |
| 4,513,815 A | 4/1985 | Rundell et al. |
| 4,524,826 A | 6/1985 | Savage |
| 4,524,827 A | 6/1985 | Bridges et al. |
| 4,545,435 A | 10/1985 | Bridges et al. |
| 4,553,592 A | 11/1985 | Looney et al. |
| 4,557,327 A | 12/1985 | Kinley et al. |
| 4,576,231 A | 3/1986 | Dowling et al. |
| 4,583,589 A | 4/1986 | Kasevich |
| 4,592,423 A | 6/1986 | Savage et al. |
| 4,612,988 A | 9/1986 | Segalman |
| 4,620,593 A | 11/1986 | Haagensen |
| 4,660,636 A | 4/1987 | Rundell et al. |
| 4,705,108 A | 11/1987 | Little et al. |
| 4,817,711 A | 4/1989 | Jearnbey |
| 5,037,704 A | 8/1991 | Nakai et al. |
| 5,055,180 A | 10/1991 | Klaila |
| 5,068,819 A | 11/1991 | Misra et al. |
| 5,082,054 A | 1/1992 | Kiamanesh |
| 5,092,056 A | 3/1992 | Deaton |
| 5,107,705 A | 4/1992 | Wraight et al. |
| 5,107,931 A | 4/1992 | Valka et al. |
| 5,228,518 A | 7/1993 | Wilson et al. |
| 5,236,039 A | 8/1993 | Edelstein et al. |
| 5,278,550 A | 1/1994 | Rhein-Knudsen et al. |
| 5,388,648 A | 2/1995 | Jordan, Jr. |
| 5,490,598 A | 2/1996 | Adams |
| 5,501,248 A | 3/1996 | Kiest, Jr. |
| 5,690,826 A | 11/1997 | Cravello |
| 5,803,666 A | 9/1998 | Keller |
| 5,813,480 A | 9/1998 | Zaleski, Jr. et al. |
| 5,853,049 A | 12/1998 | Keller |
| 5,890,540 A | 4/1999 | Pia et al. |
| 5,899,274 A | 5/1999 | Frauenfeld et al. |
| 5,947,213 A | 9/1999 | Angle |
| 5,958,236 A | 9/1999 | Bakula |
| RE36,362 E | 11/1999 | Jackson |
| 6,012,526 A | 1/2000 | Jennings et al. |
| 6,041,860 A | 3/2000 | Nazzal et al. |
| 6,096,436 A | 8/2000 | Inspektor |
| 6,170,531 B1 | 1/2001 | Jung et al. |
| 6,173,795 B1 | 1/2001 | McGarian et al. |
| 6,189,611 B1 | 2/2001 | Kasevich |
| 6,254,844 B1 | 7/2001 | Takeuchi et al. |
| 6,268,726 B1 | 7/2001 | Prammer |
| 6,269,953 B1 | 8/2001 | Seyffert et al. |
| 6,290,068 B1 | 9/2001 | Adams et al. |
| 6,325,216 B1 | 12/2001 | Seyffert et al. |
| 6,328,111 B1 | 12/2001 | Bearden et al. |
| 6,354,371 B1 | 3/2002 | O'Blanc |
| 6,371,302 B1 | 4/2002 | Adams et al. |
| 6,413,399 B1 | 7/2002 | Kasevich |
| 6,443,228 B1 | 9/2002 | Aronstam |
| 6,454,099 B1 | 9/2002 | Adams et al. |
| 6,510,947 B1 | 1/2003 | Schulte et al. |
| 6,534,980 B2 | 2/2003 | Toufaily et al. |
| 6,544,411 B2 | 4/2003 | Varandaraj |
| 6,561,269 B1 | 5/2003 | Brown et al. |
| 6,571,877 B1 | 6/2003 | Van Bilderbeek |
| 6,607,080 B2 | 8/2003 | Winkler et al. |
| 6,612,384 B1 | 9/2003 | Singh et al. |
| 6,623,850 B2 | 9/2003 | Kukino et al. |
| 6,629,610 B1 | 10/2003 | Adams et al. |
| 6,637,092 B1 | 10/2003 | Menzel |
| 6,678,616 B1 | 1/2004 | Winkler et al. |
| 6,722,504 B2 | 4/2004 | Schulte et al. |
| 6,761,230 B2 | 7/2004 | Cross et al. |
| 6,814,141 B2 | 11/2004 | Huh et al. |
| 6,845,818 B2 | 1/2005 | Tutuncu et al. |
| 6,850,068 B2 | 2/2005 | Chernali et al. |
| 6,895,678 B2 | 5/2005 | Ash et al. |
| 6,912,177 B2 | 6/2005 | Smith |
| 6,971,265 B1 | 12/2005 | Sheppard et al. |
| 6,993,432 B2 | 1/2006 | Jenkins et al. |
| 7,000,777 B2 | 2/2006 | Adams et al. |
| 7,013,992 B2 | 3/2006 | Tessari et al. |
| 7,048,051 B2 | 5/2006 | McQueen |
| 7,091,460 B2 | 8/2006 | Kinzer |
| 7,109,457 B2 | 9/2006 | Kinzer |
| 7,115,847 B2 | 10/2006 | Kinzer |
| 7,216,767 B2 | 5/2007 | Schulte et al. |
| 7,312,428 B2 | 12/2007 | Kinzer |
| 7,322,776 B2 | 1/2008 | Webb et al. |

(56) References Cited

U.S. PATENT DOCUMENTS

| | | |
|---|---|---|
| 7,331,385 B2 | 2/2008 | Symington |
| 7,376,514 B2 | 5/2008 | Habashy et al. |
| 7,387,174 B2 | 6/2008 | Lurie |
| 7,445,041 B2 | 11/2008 | O'Brien |
| 7,455,117 B1 | 11/2008 | Hall et al. |
| 7,461,693 B2 | 12/2008 | Considine et al. |
| 7,484,561 B2 | 2/2009 | Bridges |
| 7,562,708 B2 | 7/2009 | Cogliandro et al. |
| 7,629,497 B2 | 12/2009 | Pringle |
| 7,631,691 B2 | 12/2009 | Symington et al. |
| 7,650,269 B2 | 1/2010 | Rodney |
| 7,677,673 B2 | 3/2010 | Tranquilla et al. |
| 7,730,625 B2 | 6/2010 | Blake |
| 7,951,482 B2 | 5/2011 | Ichinose et al. |
| 7,980,392 B2 | 7/2011 | Varco |
| 8,237,444 B2 | 8/2012 | Simon |
| 8,245,792 B2 | 8/2012 | Trinh et al. |
| 8,275,549 B2 | 9/2012 | Sabag et al. |
| 8,484,858 B2 | 7/2013 | Brannigan et al. |
| 8,511,404 B2 | 8/2013 | Rasheed |
| 8,526,171 B2 | 9/2013 | Wu et al. |
| 8,528,668 B2 | 9/2013 | Rasheed |
| 8,567,491 B2 | 10/2013 | Lurie |
| 8,794,062 B2 | 8/2014 | DiFoggio et al. |
| 8,884,624 B2 | 11/2014 | Homan et al. |
| 8,925,213 B2 | 1/2015 | Sallwasser |
| 8,960,215 B2 | 2/2015 | Cui et al. |
| 9,109,429 B2 | 8/2015 | Xu et al. |
| 9,217,323 B2 | 12/2015 | Clark |
| 9,222,350 B2 | 12/2015 | Vaughn et al. |
| 9,250,339 B2 | 2/2016 | Ramirez |
| 9,394,782 B2 | 7/2016 | DiGiovanni et al. |
| 9,435,159 B2 | 9/2016 | Scott |
| 9,464,487 B1 | 10/2016 | Zurn |
| 9,470,059 B2 | 10/2016 | Zhou |
| 9,494,032 B2 | 11/2016 | Roberson et al. |
| 9,528,366 B2 | 12/2016 | Selman et al. |
| 9,562,987 B2 | 2/2017 | Guner et al. |
| 9,664,011 B2 | 5/2017 | Kruspe et al. |
| 9,702,211 B2 | 7/2017 | Tinnen |
| 9,731,471 B2 | 8/2017 | Schaedler et al. |
| 9,739,141 B2 | 8/2017 | Zeng et al. |
| 10,000,983 B2 | 6/2018 | Jackson et al. |
| 10,174,577 B2 | 1/2019 | Leuchtenberg et al. |
| 10,233,372 B2 | 3/2019 | Ramasamy et al. |
| 10,394,193 B2 | 8/2019 | Li et al. |
| 2003/0159776 A1 | 8/2003 | Graham |
| 2003/0230526 A1 | 12/2003 | Okabayshi et al. |
| 2004/0182574 A1 | 9/2004 | Sarmad et al. |
| 2004/0256103 A1 | 12/2004 | Batarseh |
| 2005/0259512 A1 | 11/2005 | Mandal |
| 2006/0016592 A1 | 1/2006 | Wu |
| 2006/0106541 A1 | 5/2006 | Hassan et al. |
| 2006/0144620 A1 | 7/2006 | Cooper |
| 2006/0185843 A1 | 8/2006 | Smith |
| 2006/0249307 A1 | 11/2006 | Ritter |
| 2007/0131591 A1 | 6/2007 | Pringle |
| 2007/0137852 A1 | 6/2007 | Considine et al. |
| 2007/0187089 A1 | 8/2007 | Bridges |
| 2007/0204994 A1 | 9/2007 | Wimmersperg |
| 2007/0289736 A1 | 12/2007 | Kearl et al. |
| 2008/0007421 A1 | 1/2008 | Liu et al. |
| 2008/0047337 A1 | 2/2008 | Chemali et al. |
| 2008/0173480 A1 | 7/2008 | Annaiyappa et al. |
| 2008/0190822 A1 | 8/2008 | Young |
| 2008/0308282 A1 | 12/2008 | Standridge et al. |
| 2009/0164125 A1 | 6/2009 | Bordakov et al. |
| 2009/0178809 A1 | 7/2009 | Jeffryes et al. |
| 2009/0259446 A1 | 10/2009 | Zhang et al. |
| 2010/0089583 A1 | 4/2010 | Xu et al. |
| 2010/0276209 A1 | 11/2010 | Yong et al. |
| 2010/0282511 A1 | 11/2010 | Maranuk |
| 2011/0011576 A1 | 1/2011 | Cavender et al. |
| 2011/0120732 A1 | 5/2011 | Lurie |
| 2012/0012319 A1 | 1/2012 | Dennis |
| 2012/0111578 A1 | 5/2012 | Tverlid |
| 2012/0132418 A1 | 5/2012 | McClung |
| 2012/0173196 A1 | 7/2012 | Miszewski |
| 2012/0222854 A1 | 9/2012 | McClung, III |
| 2012/0273187 A1 | 11/2012 | Hall |
| 2013/0008653 A1 | 1/2013 | Schultz et al. |
| 2013/0008671 A1 | 1/2013 | Booth |
| 2013/0025943 A1 | 1/2013 | Kumar |
| 2013/0076525 A1 | 3/2013 | Vu et al. |
| 2013/0125642 A1 | 5/2013 | Parfitt |
| 2013/0126164 A1 | 5/2013 | Sweatman et al. |
| 2013/0213637 A1 | 8/2013 | Kearl |
| 2013/0255936 A1 | 10/2013 | Statoilydro et al. |
| 2014/0083771 A1 | 3/2014 | Clark |
| 2014/0183143 A1 | 7/2014 | Cady et al. |
| 2014/0231147 A1 | 8/2014 | Bozso et al. |
| 2014/0246235 A1 | 9/2014 | Yao |
| 2014/0251894 A1 | 9/2014 | Larson et al. |
| 2014/0278111 A1 | 9/2014 | Gerrie et al. |
| 2014/0291023 A1 | 10/2014 | Edbury |
| 2014/0333754 A1 | 11/2014 | Graves et al. |
| 2014/0360778 A1 | 12/2014 | Batarseh |
| 2014/0375468 A1 | 12/2014 | Wilkinson et al. |
| 2015/0020908 A1 | 1/2015 | Warren |
| 2015/0021240 A1 | 1/2015 | Wardell et al. |
| 2015/0083422 A1 | 3/2015 | Pritchard |
| 2015/0091737 A1 | 4/2015 | Richardson et al. |
| 2015/0101864 A1 | 4/2015 | May |
| 2015/0159467 A1 | 6/2015 | Hartman et al. |
| 2015/0211362 A1 | 7/2015 | Rogers |
| 2015/0267500 A1 | 9/2015 | Van Dogen |
| 2015/0290878 A1 | 10/2015 | Houben et al. |
| 2016/0053572 A1 | 2/2016 | Snoswell |
| 2016/0076357 A1 | 3/2016 | Hbaieb |
| 2016/0115783 A1 | 4/2016 | Zeng et al. |
| 2016/0153240 A1 | 6/2016 | Braga et al. |
| 2016/0160106 A1 | 6/2016 | Jamison et al. |
| 2016/0237810 A1 | 8/2016 | Beaman et al. |
| 2016/0247316 A1 | 8/2016 | Whalley et al. |
| 2016/0356125 A1 | 12/2016 | Bello et al. |
| 2017/0161885 A1 | 6/2017 | Parmeshwar et al. |
| 2017/0234104 A1 | 8/2017 | James |
| 2017/0292376 A1 | 10/2017 | Kumar et al. |
| 2017/0314335 A1 | 11/2017 | Kosonde et al. |
| 2017/0328196 A1 | 11/2017 | Shi et al. |
| 2017/0328197 A1 | 11/2017 | Shi et al. |
| 2017/0342776 A1 | 11/2017 | Bullock et al. |
| 2017/0350201 A1 | 12/2017 | Shi et al. |
| 2017/0350241 A1 | 12/2017 | Shi |
| 2018/0010030 A1 | 1/2018 | Ramasamy et al. |
| 2018/0010419 A1 | 1/2018 | Livescu et al. |
| 2018/0171772 A1 | 6/2018 | Rodney |
| 2018/0187498 A1 | 7/2018 | Soto et al. |
| 2018/0265416 A1 | 9/2018 | Ishida et al. |
| 2018/0282230 A1 | 10/2018 | Oh et al. |
| 2018/0326679 A1 | 11/2018 | Weisenberg et al. |
| 2019/0049054 A1 | 2/2019 | Gunnarsson et al. |
| 2019/0101872 A1 | 4/2019 | Li |
| 2019/0227499 A1 | 7/2019 | Li et al. |
| 2019/0257180 A1 | 8/2019 | Kriesels et al. |
| 2020/0032638 A1 | 1/2020 | Ezzeddine |

FOREIGN PATENT DOCUMENTS

| | | |
|---|---|---|
| CN | 204627586 | 9/2015 |
| CN | 107462222 | 12/2017 |
| CN | 108470856 | 8/2018 |
| CN | 110571475 | 12/2019 |
| EP | 2317068 | 5/2011 |
| EP | 2574722 | 4/2013 |
| EP | 2737173 | 6/2014 |
| GB | 2357305 | 6/2001 |
| GB | 2399515 | 9/2004 |
| GB | 2422125 | 7/2006 |
| GB | 2532967 | 6/2016 |
| JP | 2009067609 | 4/2009 |
| JP | 4275896 | 6/2009 |
| JP | 5013156 | 8/2012 |
| NO | 343139 | 11/2018 |

(56) References Cited

FOREIGN PATENT DOCUMENTS

| NO | 20161842 | | 5/2019 | |
|---|---|---|---|---|
| RU | 2282708 | | 8/2006 | |
| WO | WO 2000025942 | | 5/2000 | |
| WO | WO 2001042622 | | 6/2001 | |
| WO | WO 2002068793 | | 9/2002 | |
| WO | WO 2008146017 | | 12/2008 | |
| WO | WO 2009020889 | | 2/2009 | |
| WO | WO 2009113895 | | 9/2009 | |
| WO | WO 2010105177 | | 9/2010 | |
| WO | WO 2011038170 | | 3/2011 | |
| WO | WO 2011042622 | | 6/2011 | |
| WO | WO 2013016095 | | 1/2013 | |
| WO | WO 2013148510 | | 10/2013 | |
| WO | WO 2015095155 | | 6/2015 | |
| WO | WO 2016178005 | | 11/2016 | |
| WO | WO 2017011078 | | 1/2017 | |
| WO | WO 2017132297 | | 8/2017 | |
| WO | WO 2018169991 | | 9/2018 | |
| WO | WO 2019040091 | | 2/2019 | |
| WO | WO 2019055240 | | 3/2019 | |
| WO | WO 2019089926 | | 5/2019 | |
| WO | WO 2019108931 | | 6/2019 | |
| WO | WO 2019161301 | * | 8/2019 | ............... B22F 3/10 |
| WO | WO 2019169067 | | 9/2019 | |
| WO | WO 2019236288 | | 12/2019 | |
| WO | WO 2019246263 | | 12/2019 | |

OTHER PUBLICATIONS

"IADC Dull Grading for PDC Drill Bits," Beste Bit, SPE/IADC 23939, 1992, 52 pages.
Akersolutions, Aker MH CCTC Improving Safety, Jan. 2008, 12 pages.
Anwar et al., "Fog computing: an overview of big IoT data analytics," Wireless communications and mobile computing, May 2018, 2018: 1-22.
Artymiuk et al., "The new drilling control and monitoring system," Acta Montanistica Slovaca, Sep. 2004, 9(3): 145-151.
Ashby et al., "Coiled Tubing Conveyed Video Camera and Multi-Arm Caliper Liner Damage Diagnostics Post Plug and Perf Frac," Society of Petroleum Engineers, SPE-172622-MS, Mar. 2015, pp. 12.
Bilal et al., "Potentials, trends, and prospects in edge technologies: Fog, cloudlet, mobile edge, and micro data centers," Computer Networks, Elsevier, Oct. 2017, 130: 94-120.
Carpenter, "Advancing Deepwater Kick Detection", JPT, vol. 68, Issue 5, May 2016, 2 pages.
Commer et al., "New advances in three-dimensional controlled-source electromagnetic inversion," Geophys. J. Int., 2008, 172: 513-535.
Dickens et al., "An LED array-based light induced fluorescence sensor for real-time process and field monitoring," Sensors and Actuators B: Chemical, Elsevier, Apr. 2011, 158(1): 35-42.
Dong et al., "Dual Substitution and Spark Plasma Sintering to Improve Ionic Conductivity of Garnet Li7La3Zr2O12," Nanomaterials, 9, 721, 2019, 10 pages.
downholediagnostic.com [online] "Acoustic Fluid Level Surveys," retrieved from URL <https://www.downholediagnostic.com/fluid-level> retrieved on Mar. 27, 2020, available on or before 2018, 13 pages.
edition.cnn.com [online], "Revolutionary gel is five times stronger than steel," retrieved from URL <https://edition.cnn.com/style/article/hydrogel-steel-japan/index.html>, retrieved on Apr. 2, 2020, available on or before Jul. 16, 2017, 6 pages.
Gemmeke and Ruiter, "3D ultrasound computer tomography for medical imagining," Nuclear Instruments and Methods in Physics Research A 580, Oct. 1, 2007, 9 pages.
Halliburton, "Drill Bits and Services Solutions Catalogs," retrieved from URL: <https://www.halliburton.com/content/dam/ps/public/sdbs/sdbs_contents/Books_and_Catalogs/web/DBS-Solution.pdf> on Sep. 26, 2019. Copyright 2014, 64 pages.
Ji et al., "Submicron Sized Nb Doped Lithium Garnet for High Ionic Conductivity Solid Electrolyte and Performance of All Solid-State Lithium Battery," doi:10.20944/preprints201912.0307.v1, Dec. 2019, 10 pages.
Johnson et al., "Advanced Deepwater Kick Detection," IADC/SPE 167990, presented at the 2014 IADC/SPE Drilling Conference and Exhibition, Mar. 4-6, 2014, 10 pages.
Johnson, "Design and Testing of a Laboratory Ultrasonic Data Acquisition System for Tomography" Thesis for the degree of Master of Science in Mining and Minerals Engineering, Virginia Polytechnic Institute and State University, Dec. 2, 2004, 108 pages.
King et al., "Atomic layer deposition of TiO2 films on particles in a fluidized bed reactor," Power Technology, vol. 183, Issue 3, Apr. 2008, 8 pages.
Li et al., 3D Printed Hybrid Electrodes for Lithium-ion Batteries, Missouri University of Science and Technology, Washington State University; ECS Transactions, 77 (11) 1209-1218 (2017), 11 pages.
Liu et al., "Flow visualization and measurement in flow field of a torque converter," Mechanic automation and control Engineering, Second International Conference on IEEE, Jul. 15, 2011, 1329-1331.
Liu et al., "Superstrong micro-grained polycrystalline diamond compact through work hardening under high pressure," Appl. Phys. Lett. Feb. 2018, 112: 6 pages.
nature.com [online], "Mechanical Behavior of a Soft Hydrogel Reinforced with Three-Dimensional Printed Microfibre Scaffolds," retrieved from URL <https://www.nature.com/articles/s41598-018-19502-y>, retrieved on Apr. 2, 2020, available on or before Jan. 19, 2018, 47 pages.
Nuth, "Smart oil field distributed computing," The Industrial Ethernet Book, Nov. 2014, 85(14): 1-3.
Olver, "Compact Antenna Test Ranges," Seventh International Conference on Antennas and Propagation IEEE , Apr. 15-18, 1991, 10 pages.
Parini et al., "Chapter 3: Antenna measurements," in Theory and Practice of Modern Antenna Range Measurements, IET editorial, 2014, 30 pages.
petrowiki.org [online], "Kicks," Petrowiki, available on or before Jun. 26, 2015, retrieved on Jan. 24, 2018, retrieved from URL <https://petrowiki.org/Kicks>, 6 pages.
rigzone.com [online], "How does Well Control Work?" Rigzone, available on or before 1999, retrieved on Jan. 24, 2019, retrieved from URL <https://www.rigzone.com/training/insight.asp?insight_id=304&c_id>, 5 pages.
Ruiter et al., "3D ultrasound computer tomography of the breast: A new era?" European Journal of Radiology 81S1, Sep. 2012, 2 pages.
sageoiltools.com [online] "Fluid Level & Dynamometer Instrumens for Analysis due Optimization of Oil and Gas Wells," retrieved from URL <http://www.sageoiltools.com/>, retrieved on Mar. 27, 2020, available on or before 2019, 3 pages.
Schlumberger, "First Rigless ESP Retrieval and Replacement with Slickline, Offshore Congo: Zeitecs Shuttle System Eliminates Need to Mobilize a Workover Rig," slb.com/zeitecs, 2016, 1 page.
Schlumberger, "The Lifting Business," Offshore Engineer, Mar. 2017, 1 page.
Schlumberger, "Zeitecs Shuttle System Decreases ESP Replacement Time by 87%: Customer ESP riglessly retrieved in less than 2 days on coiled tubing," slb.com/zeitecs, 2015, 1 page.
Schlumberger, "Zeitecs Shuttle System Reduces Deferred Production Even Before ESP is Commissioned, Offshore Africa: Third Party ESP developed fault during installation and was retrieved on rods, enabling operator to continue running tubing without waiting on replacement," slb.com/zeitecs, 2016, 2 pages.
Schlumberger, "Zeitecs Shuttle: Rigless ESP replacement system," Brochure, 8 pages.
Schlumberger, "Zeitecs Shuttle: Rigless ESP replacement system," Schlumberger, 2017, 2 pages.
slb.com' [online] "Technical Paper: ESP Retrievable Technology: A Solution to Enhance ESP Production While Minimizing Costs, " SPE 156189 presented in 2012, retrieved from URL <http://www.

(56) References Cited

OTHER PUBLICATIONS slb.com/resources/technical_papers/artificial_lift/156189.aspx>, retrieved on Nov. 2, 2018, 1 pages.

slb.com' [online], "Zeitecs Shuttle Rigless ESP Replacement System," retrieved from URL <http://www.slb.com/services/production/artificial_lift/submersible/zeitecs-shuttle.aspx?t=3>, available on or before May 31, 2017, retrieved on Nov. 2, 2018, 3 pages.

Sulzer Metco, "An Introduction to Thermal Spray," Issue 4, 2013, 24 pages.

Wei et al., "The Fabrication of All-Solid-State Lithium-Ion Batteries via Spark Plasma Sintering," Metals, 7, 372, 2017, 9 pages.

wikipedia.org [online] "Optical Flowmeters," retrieved from URL <https://en.wikipedia.org/wiki/Flow_measurement#Optical_flowmeters>, retrieved on Mar. 27, 2020, available on or before Jan. 2020, 1 page.

wikipedia.org [online] "Ultrasonic Flow Meter," retrieved from URL <https://en.wikipedia.org/wiki/Ultrasonic_flow_meter> retrieved on Mar. 27, 2020, available on or before Sep. 2019, 3 pages.

wikipedia.org [online], "Surface roughness," retrieved from URL <https://en.wikipedia.org/wiki/Surface_roughness> retrieved on Apr. 2, 2020, available on or before Oct. 2017, 6 pages.

Xue et al., "Spark plasma sintering plus heat-treatment of Ta-doped Li7La3Zr2O12 solid electrolyte and its ionic conductivity," Mater. Res. Express 7 (2020) 025518, 8 pages.

Zhan et al. "Effect of ß-to-α Phase Transformation on the Microstructural Development and Mechanical Properties of Fine-Grained Silicon Carbide Ceramics." Journal of the American Ceramic Society 84.5, May 2001, 6 pages.

Zhan et al. "Single-wall carbon nanotubes as attractive toughening agents in alumina-based nanocomposites." Nature Materials 2.1, Jan. 2003, 6 pages.

Zhan et al., "Atomic Layer Deposition on Bulk Quantities of Surfactant Modified Single-Walled Carbon Nanotubes," Journal of American Ceramic Society, vol. 91, Issue 3, Mar. 2008, 5 pages.

Zhang et al., "Increasing Polypropylene High Temperature Stability by Blending Polypropylene-Bonded Hindered Phenol Antioxidant," Macromolecules, 51(5), pp. 1927-1936, 2018, 10 pages.

Zhu et al., "Spark Plasma Sintering of Lithium Aluminum Germanium Phosphate Solid Electrolyte and its Electrochemical Properties," University of British Columbia; Nanomaterials, 9, 1086, 2019, 10 pages.

* cited by examiner

ELECTROLYTE STRUCTURE FOR A HIGH-TEMPERATURE, HIGH-PRESSURE LITHIUM BATTERY

CROSS REFERENCE TO RELATED PATENT APPLICATIONS

This application is a divisional of and claims the benefit of priority to U.S. patent application Ser. No. 16/890,474, filed Jun. 2, 2020. The contents of which are incorporated by reference herein.

TECHNICAL FIELD

This disclosure relates to solid state electrolytes for lithium ion batteries.

BACKGROUND

Downhole logging tools, such as wireline logging tools, measurement while drilling (MWD), and logging while drilling (LWD), are often used to obtain information about the geological formations, hydrocarbons, drilling tools and fluids in and around a wellbore. These tools may be connected to a line from the surface, termed a wireline, that provides both power and data access. The depth of many wells, especially in a subsea environment, may make the use of a wireline impractical. Accordingly, battery-powered devices are in development to allow measurements to be taken in a wellbore.

However, battery-operated devices for downhole equipment often operate in harsh wellbore environments, such as high temperatures (greater than about 200° C.) and high pressures (up to about 20,000 psi). Therefore, new high pressure, high temperature (HPHT) battery technologies are needed for many downhole applications.

SUMMARY

An embodiment described herein provides a method for making an electrolyte for a high-temperature, high-pressure lithium ion battery. The method includes coating polymer electrolyte particles with an oxide to make coated polymer electrolyte particles and printing a polymer electrolyte preform in a binder jet printer from the coated polymer electrolyte particles and a composite electrolyte structure is formed, at least in part from the polymer electrolyte preform.

Another embodiment described herein provides a composite electrolyte structure. The composite electrolyte structure includes, at least in part, polymer electrolyte preforms that are bonded into the composite electrolyte structure.

DETAILED DESCRIPTION

Figure 1:
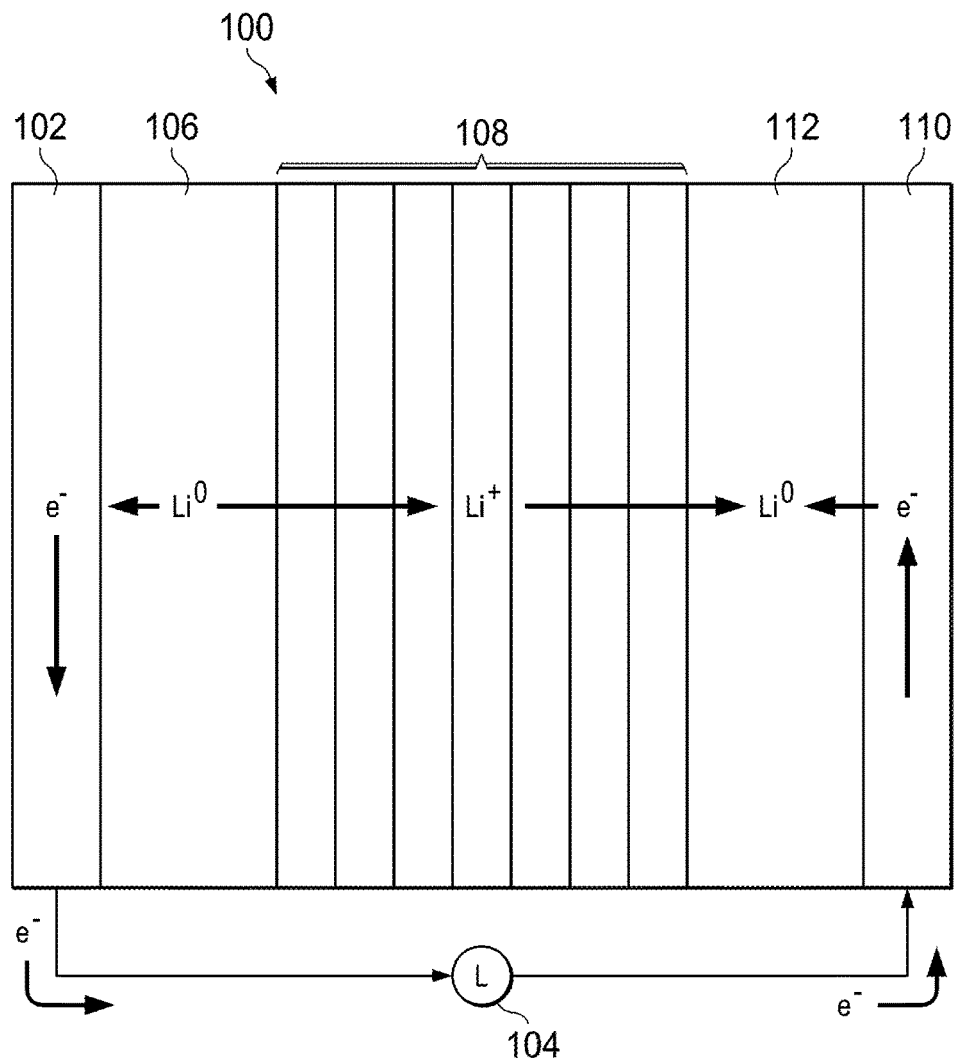
FIG. 1 is a schematic drawing of a high temperature high pressure (HTHP) lithium ion battery (LIB) in use.

Reliable rechargeable downhole energy systems with high energy density capable of operating at high temperatures and high pressures, termed HTHP herein, would be useful for both onshore and offshore applications. The downhole temperatures in onshore wellbores typically range from 150° C. to 250° C. For offshore applications, in addition to the high temperatures, high pressures of up to 20,000 psi are often encountered. Currently, the operating temperatures for primary and non-rechargeable batteries, for example, for MWD/LWD applications, range from about 160° C. to about 180° C.

Lithium-ion batteries (LIBs) have gradually become an important power source for many applications, including power leveling, transportation, electronics, and oil-field equipment, among many others. The performance of lithium-ion batteries depends on the materials used, so the development of new materials is important to facilitate the development of battery technology for new applications.

The development of new materials has two focal points. The first is the development of electrode materials that have high-energy, rapid charge and discharge, and long-term stability. The other is the development of different types of electrolytes for different purposes. Expanding the operating temperature range of LIBs is an important consideration. Since the liquid electrolytes used in conventional LIBs are mainly based on $LiPF_6$ lithium salts, thionyl chloride, and low-boiling organic solvents, such as propylene carbonate (PC) and ethylene carbonate (EC), they cannot operate steadily and safely at higher temperatures than their functional temperature. Accordingly, solid electrolytes that are suitable for high temperature working environments are a research target. The techniques disclosed herein are directed to new electrolyte materials for rechargeable HTHP LIBs for these types of environments.

The use of solid electrolytes eliminates the need for sealed liquid electrolytes, simplifying battery design, improving safety and durability. Solid-state batteries have many advantages, such as the elimination of the risk of spontaneous combustion or explosion. Traditional lithium-ion batteries with electromechanical electrolytes are prone to heat generation in the electrolyte under abnormal conditions, such as overcharging and internal short circuits, and there is a risk of spontaneous combustion or even explosion. All solid lithium batteries are made of solid materials, which are non-flammable, non-corrosive, non-volatile, and have no liquid leakage. Other types of LIBs, such as semi-solid and quasi-solid batteries, still have a certain risk of flammability but the safety is higher than liquid electrolyte batteries.

Further, solid-state batteries do not require electrolytes or diaphragms for electrolyte expansion. These two parts add up to nearly 40% of the volume and 25% mass in conventional LIBs. Thus, the battery housing and cooling system module can be simplified to further reduce the weight of the battery system. In addition, the new positive and negative materials can enable electrochemical windows to reach more than 5V, which can fundamentally increase energy density, estimated to reach 500 Wh/Kg.

FIG. 1 is a schematic drawing of a high temperature high pressure (HTHP) lithium ion battery (LIB) 100 in use. In the HTHP LIB 100, electrons flow from an anode current collector 102, such as a copper film to power a load 104. As the electrons are removed from the anode current collector 102, electrons are formed in the anode material 106, as lithium atoms are converted to $Li^+$ ions. The $Li^+$ ions are transported from the anode material 106 through an electrolyte layer 108 to a cathode material 112.

After powering the load 104, the electrons are returned to the HTHP LIB 100 through a cathode current collector 110. From the cathode current collector 110, the electrons are transported to a cathode material 112, in which the electrons combine with the $Li^+$ ions to form $Li^0$ atoms. The $Li^0$ atoms are then stored in the cathode material 112.

As described further herein, in the HTHP LIB 100 the electrolyte layer 108 is a composite electrolyte structure. In some embodiments, the composite electrolyte structure includes multiple layers of a solid polymer electrolyte. In other embodiments, the composite electrolyte structure includes multiple layers of both a solid polymer electrolyte and a ceramic electrolyte. In some embodiments, the composite electrolyte structure is formed of alternating layers of a solid polymer electrolyte and a ceramic electrolyte.

Figure 2:
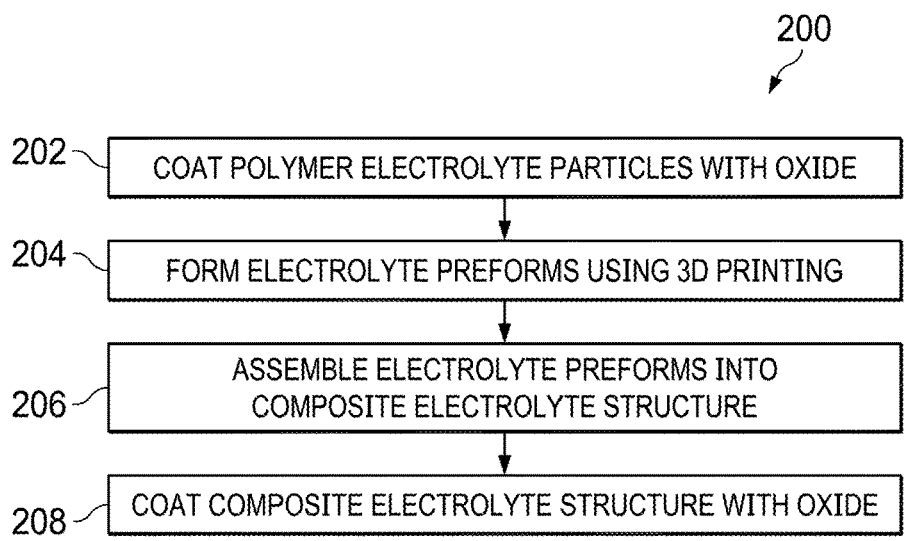
FIG. 2 is a process flow drawing of a method for the formation of a composite electrolyte structure.

FIG. 2 is a process flow drawing of a method 200 for the formation of a composite electrolyte structure. The method 200 begins at block 202 with the coating of polymer electrolyte particles with an oxide. In various embodiments, the polymer electrolyte particles include poly(vinylidene fluoride)-co-hexafluoropropylene (PVDF-HFP), poly(ethylene oxide) (PEO), poly (Methylmethacrylate) (PMMA), polyacrylonitrile (PAN), or other polymers. In various embodiments, the oxide is a nanocoating of a ceramic material, such as $Al_2O_3$, $SiO_2$, $ZrO_2$, $Y_2O_3$, or a combination thereof.

In some embodiments, the coating is performed by atomic layer deposition (ALD), for example, by flowing reagents through a fluidized powder bed. ALD is a type of chemical vapor deposition in which the material to be coated is sequentially exposed to reactive precursors.

In some embodiments, hydroxyl groups may be formed on the surface of the polymer electrolyte particles by functionalization, plasma treatment, heat treatment, or other techniques. A first precursor is introduced to react with the hydroxyl groups on the surface. In some embodiments in which the coating is $Al_2O_3$, the first precursor is an organoaluminum, such as trimethyl aluminum (TMA) or triethyl aluminum (TEA), among others. The organoaluminum reacts with the hydroxyl groups until there are no more hydroxyl groups left. The reaction chamber, or fluidized bed, is then purged to remove excess organoaluminum vapor and a second precursor is introduced. In some embodiments, the second precursor is water. The water reacts with the organoaluminum on the surface, forming a layer of aluminum oxide. If a thicker layer is desirable, these steps may be repeated, wherein the last step in each iteration is the reaction with water.

In some embodiments in which the coating is $SiO_2$, a catalytic ALD process is used. In some embodiments, the first precursor is mixture of silicon tetrachloride ($SiCl_4$) and a Lewis-based catalyst, such as ammonia, which reacts with hydroxyl groups on the surface to form Si—O bonds. The reaction chamber, or fluidized bed, is then purged remove excess mixture, after which the second precursor is added, such as a water and ammonia mixture. The steps may be repeated to form a thicker layer of $SiO_2$. The coated polymer electrolyte particle is discussed further with respect to FIG. 3.

In various embodiments, ceramic electrolyte preforms are made from ceramic particles, such as lithium super-ion conductor solid electrolytes (LISICON), including $Li_{14}Zn(GeO_4)_4$ and $Li_{3.25}Ge_{0.25}P_{0.75}S_4$, among others. The ceramic particles may not be coated before use. However, in some embodiments, the ceramic electrolyte particles are coated as described above.

At block 204, electrolyte preforms are made from the coated or uncoated electrolyte particles using 3D printing, for example, in a binder jet printer. In the binder jet printing process a binder oligomer, such as an acrylate oligomer and an initiator, is printed over a powder in a layer to form a pattern. The polymerization of the binder oligomer is initiated by exposure to light or heat and the polymerization fixes the pattern in place. In some embodiments, the parts are heat treated after the preform is made. The 3D printing to form the electrolyte preforms is described further with respect to FIG. 4. Specific examples of the electrolyte preforms are shown in FIGS. 5A and 5B.

At block 206, the electrolyte preforms are assembled into a composite electrolyte structure and bonded together. In some embodiments, the bonding is performed by spark-plasma sintering (SPS). The specific electrolyte preforms chosen to form the composite electrolyte structure depend on the temperature of use. In embodiments in which the temperature of use is less than about 150° C., polymer electrolyte preforms are bonded together to form the composite electrolyte structure. In embodiments in which the temperature of use is greater than about 200° C., a ceramic electrolyte preform is placed between each of the polymer electrolyte preforms to enhance the temperature resistance in the high-temperature application. In addition to bonding the electrolyte preforms into the composite electrolyte structure, the SPS densifies the solid electrolytes and increases the interconnections. The use of SPS to bond the electrolyte preforms into the composite electrolyte structure is discussed further with respect to FIGS. 6A and 7A.

At block 206, in some embodiments, the bonding is performed by microwave sintering (MWS), as an alternative to spark-plasma sintering (SPS). In addition to bonding the electrolyte preforms into the composite electrolyte structure, the MWS densifies the solid electrolytes and increases the interconnections. The use of MWS to bond the electrolyte preforms into the composite electrolyte structure is discussed further with respect to FIGS. 6B and 7B.

At block 208, the composite electrolyte structure is coated with an oxide for further protection. In some embodiments, this is performed by ALD, for example, using the chemical process described with respect to block 202 to apply a coating of an oxide to the entire bonded structure.

Figure 3:
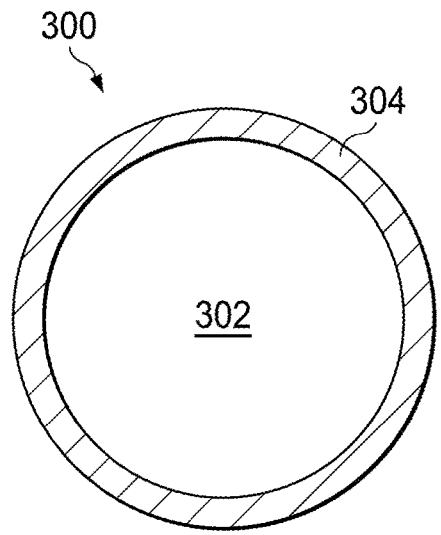
FIG. 3 is a drawing of a coated polymer electrolyte particle.

FIG. 3 is a drawing of a coated polymer electrolyte particle 300. In various embodiments, the polymer electrolyte particle 300 is spherical, as shown in FIG. 3. Although, the polymer electrolyte particle 300 may be any number of other shapes, including random particles. In some embodiments, the polymer electrolyte particle 300 is between about 20 μm and about 1000 μm in diameter, or between about 15 μm and about 60 μm in diameter, or about 40 μm in diameter.

The polymer electrolyte particle 300 has a core 302 that is a polymer electrolyte, for example, as described with respect to FIG. 2. The coating 304 is an oxide, or ceramic, that protects the polymer electrolyte particle 300. In some embodiments, the coating 304 is between about 1 nm and about 100 nm in thickness, or between about 10 nm and 50 nm in thickness, or about 30 nm in thickness.

Figure 4:
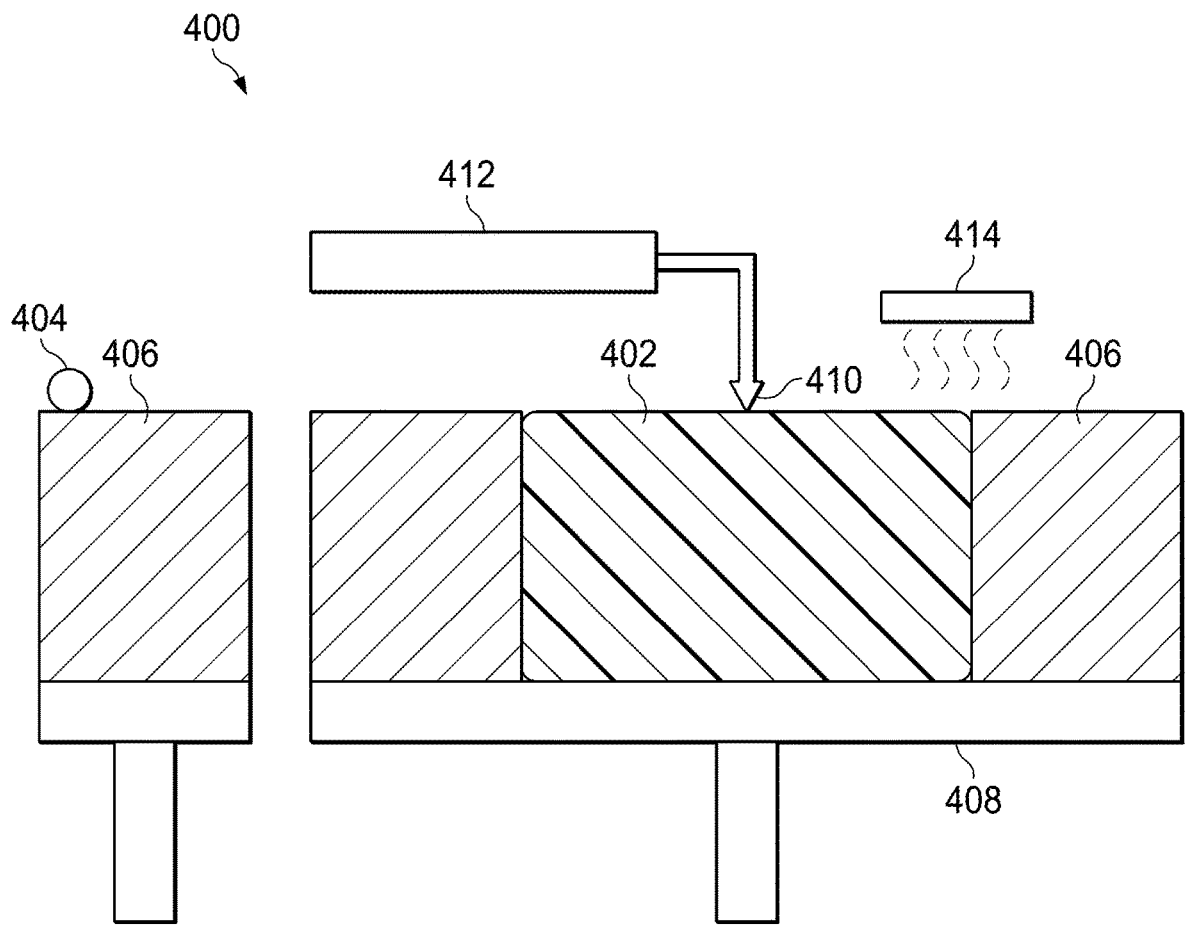
FIG. 4 is a schematic drawing of the three dimensional printing of an electrolyte preform using a binder jet printing technique.
Figure 5A:
FIG. 5A is a drawing of a polymer electrolyte preform formed from polymer electrolyte particles having an oxide coating.
Figure 5B:
FIG. 5B is a drawing of a ceramic electrolyte preform formed from ceramic particles.

FIG. 4 is a schematic drawing 400 of the three dimensional printing of an electrolyte preform 402 using a binder jet printing technique. In the binder jet printing technique, a roller 404 is used to spread a layer of electrolyte particles 406 over a platform 408 in a building chamber (not shown). A printhead 410 is used to print a pattern of a binder solution 412 over the layer of electrolyte particles 406. As used herein, the electrolyte particles 406 are either polymer electrolyte particles or ceramic electrolyte particles. In some embodiments, a mixture of polymer electrolyte particles and ceramic electrolyte particles is used to create the electrolyte preform. In some embodiments, as the printhead 410 creates the pattern, a radiation source 414 is used to initiate polymerization of the binder, such as with a UV light source activating a photoinitiator or an infrared source activating a thermal initiator.

As each layer is printed, the platform 408 is lowered, and a new layer of electrolyte particles 406 is spread over the top of the platform 408 and electrolyte preform 402 by the roller 404. The printhead 410 then prints a new pattern of binder solution 412. In some embodiments, the new pattern is fixed by radiation from the radiation source 414, before the platform 408 is lowered for another layer. Completion of the binder jet printing process results in a formed electrolyte preform 402, which is used to form the composite electrolyte structure.

FIG. 5A is a drawing of a polymer electrolyte preform 502 formed from polymer electrolyte particles having an oxide coating. The polymer electrolyte preform 502 is a green part, for example, including between about 10 vol. % percent and about 40 vol. % binder and air, or between about 20 vol. % and about 30 vol. % binder and air, or about 25 vol. % binder and air. As described herein, in some embodiments, the binder is polymerized during the printing process allowing the direct removal of the polymer electrolyte preform 502 from the loose polymer electrolyte particles. In some embodiments an initiation step is not used during the printing process and the polymer electrolyte preform 502 and loose binder particles are left together during a heating cycle to initiate the polymerization of the binder and drive off liquids, while the loose binder particles provide support to the polymer electrolyte preform 502.

The polymer electrolyte preform 502 is between about 100 μm and about 700 μm in thickness or between about 300 μm and about 500 μm in thickness. In some embodiments, the polymer electrolyte preform is about 400 μm in thickness.

FIG. 5B is a drawing of a ceramic electrolyte preform 504 formed from ceramic particles. The ceramic electrolyte preform 504 is formed from ceramic electrolyte particles using the same binder jet process as for the polymer electrolyte preform 502. As for the polymer electrolyte preform 502, the ceramic electrolyte preform 504 is a green part, for example, including between about 10 vol. % percent and about 40 vol. % binder and air, or between about 20 vol. % and about 30 vol. % binder and air, or about 25 vol. % binder and air. As described herein, in some embodiments, the binder is polymerized during the printing process allowing the direct removal of the ceramic electrolyte preform 504 from the loose ceramic electrolyte particles. In some embodiments an initiation step is not used during the printing process, and the ceramic electrolyte preform and loose binder particles are left together during a heating cycle to initiate the polymerization of the binder and drive off liquids while the loose binder particles provide support to the ceramic electrolyte preform 504.

Figure 6A:
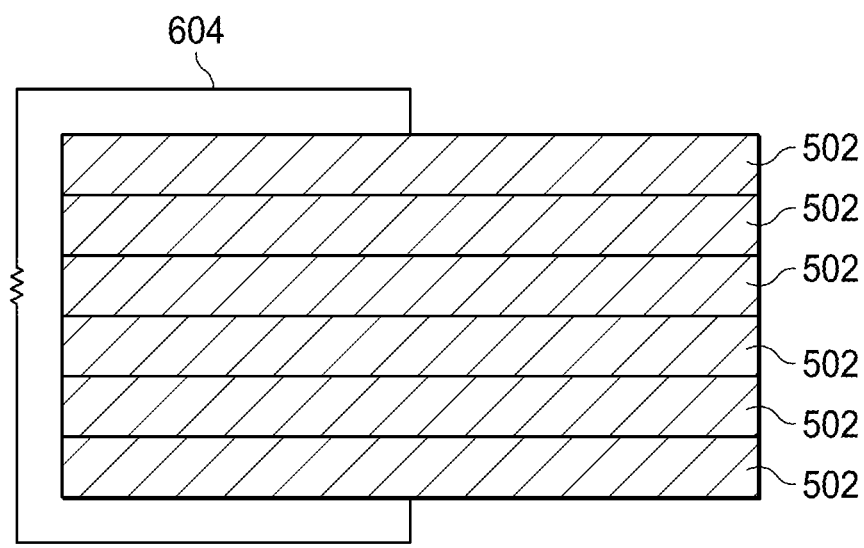
FIG. 6A is a schematic drawing of the pulse bonding of a number of polymer electrolyte preforms formed from polymer electrolyte particles into a composite electrolyte structure using spark plasma sintering.

FIG. 6A is a schematic drawing of the pulse bonding of a number of polymer electrolyte preforms 502 formed from polymer electrolyte particles into a composite electrolyte structure 602 using spark plasma sintering. Like numbered items are as described with respect to FIG. 5. The SPS is performed by holding the parts together in a die using a clamp, for example, having a conductive graphite surface for the jaw of the clamp. In various embodiments, two, three, five, six, seven, or more, polymer electrolyte preforms 502 may be bonded to form a composite electrolyte structure 602. In various embodiments, the SPS processing parameters include an applied pressure between 50 and 100 MPa, pulse cycles with a period of 2.5 ms and in a pattern of 12 cycles on and 2 cycles off, and a maximum pulse amperage 604 of 10,000 A and DC voltage of 10 V.

The SPS bonding both sinters the individual polymer electrolyte preforms 502 together to form the final composite electrolyte structure 602 and densifies the polymer electrolyte preforms 502. The densification of the polymer electrolyte preforms 502 burns away binder, and decreases the empty airspace between the coated polymer electrolyte particles.

The bonding is not limited to SPS. In some embodiments, the bonding of the polymer electrolyte preforms 502 is performed by microwave sintering (MWS).

Figure 6B:
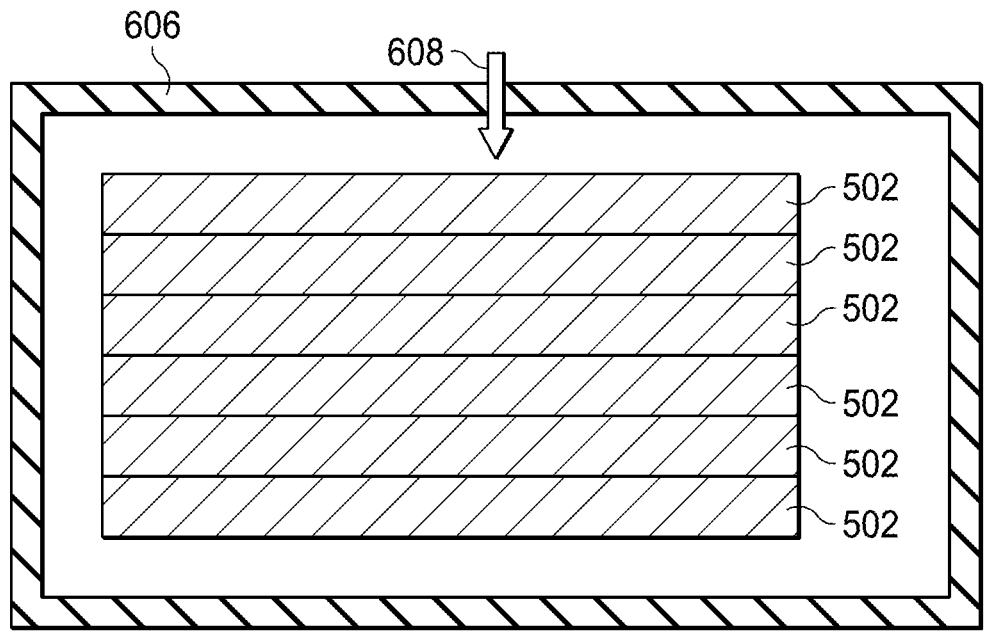
FIG. 6B is a schematic drawing of the bonding of a number of polymer electrolyte preforms formed from polymer electrolyte particles into a composite electrolyte structure using microwave sintering (MWS)

FIG. 6B is a schematic drawing of the bonding of a number of polymer electrolyte preforms 502 formed from polymer electrolyte particles into a composite electrolyte structure 602 using microwave sintering (MWS). The polymer electrolyte preforms 502 are placed in the microwave sintering chamber 606. Microwave energy is injected into the chamber through a microwave port 608. The heat is applied by triggering the interaction of the preforms and the electromagnetic energy in the frequency range of 300 MHz to 300 GHz. The localized heat among the particles in the preforms sinters them into the densified part.

Figure 6C:
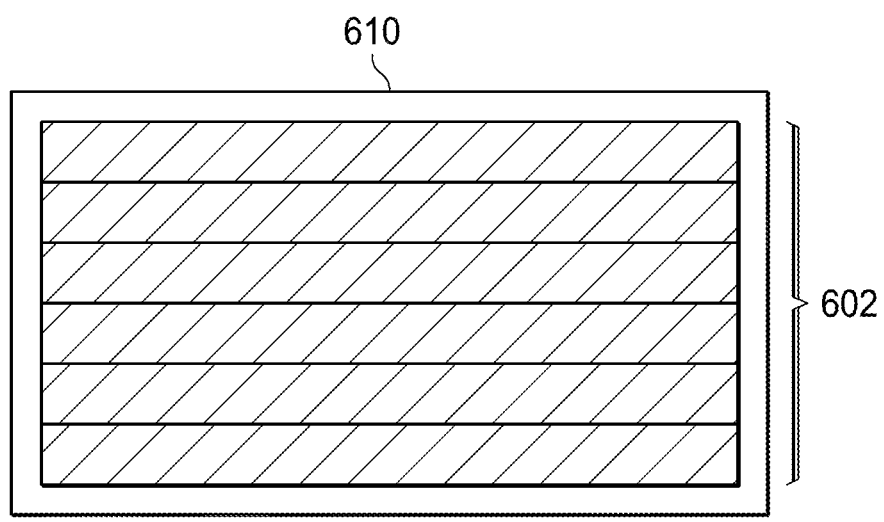
FIG. 6C is a schematic drawing of the composite electrolyte structure formed from the polymer electrolyte preforms after application of an oxide coating by atomic layer deposition.

FIG. 6C is a schematic drawing of the composite electrolyte structure 602 formed from the polymer electrolyte preforms 502 after application of an oxide coating 610 by atomic layer deposition. As described with respect to FIG. 2, the oxide coating may be applied by sequentially reacting precursors with chemical moieties, such as hydroxyl groups, on the surface.

In various embodiments, the composite electrolyte structure 602 formed from the polymer electrolyte preforms 502 is used up to a temperature of about 150° C. However, in many applications in downhole environments, the temperature will be higher than this. Accordingly, in embodiments described herein, the use of ceramic electrolyte preforms 504 (FIG. 5B), such as in an alternating configuration with the polymer electrolyte preforms 502, is used to increase the thermal stability of a composite electrolyte structure.

Figure 7A:
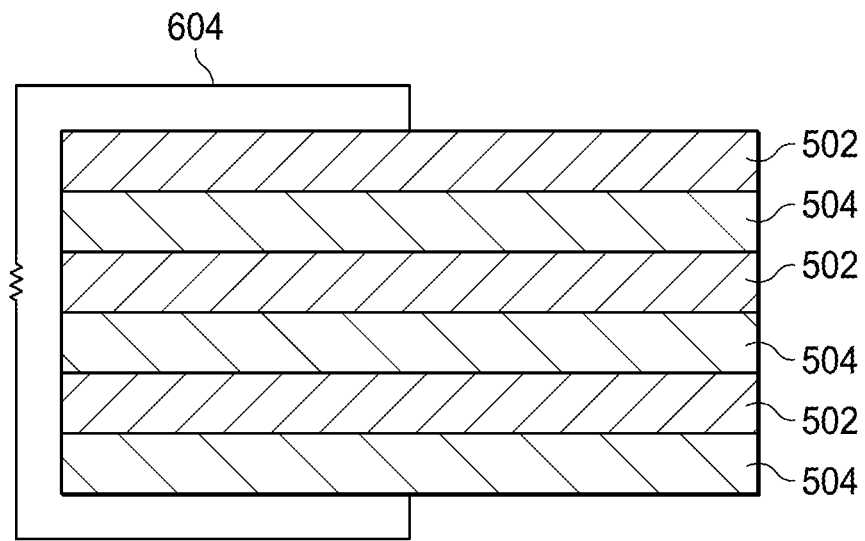
FIG. 7A is a schematic drawing of the bonding of alternating polymer electrolyte preforms and ceramic electrolyte preforms into a composite electrolyte structure using spark plasma sintering.

FIG. 7A is a schematic drawing of the bonding of alternating polymer electrolyte preforms 502 and ceramic electrolyte preforms 504 into a composite electrolyte structure 702 using spark plasma sintering. Like numbered items are as described with respect to FIGS. 5 and 6. As described herein, ceramic electrolytes have high stability over a wide temperature range, especially at high temperatures of greater than about 200° C., providing batteries that may be useful up to about 550° C. However, these electrolytes have a number of issues, including volume changes in electrode materials, large interface (electrode/electrolyte) resistance, low quality of electrode active materials, and poor cycle stability.

One of the most important issues that needs to be overcome for ceramic electrolyte is improvements in the ion conductivity of the electrode interface. During battery cycles (charge and discharge), active electrodes often experience structural fragmentation, resulting in capacity decay. Solid electrolytes with low elastic modulus are always preferred because this reduces the degree of fragmentation of the electrode material. In LiPON solid electrolytes, for example, lithium-ion transport is often hampered by the interface, while LiPON's high elastic modulus and hardness are resistant to lithium dendrites.

For battery assembly, fabrication, and manufacturing, interface contact between active electrodes and solid electrolytes can be an extremely important factor in the overall performance of the battery. In general, the malleability and ductility of solid electrolytes and electrodes have significant effects on the contact conditions of the electrode/electrolyte interface. Accordingly, the more flexible polymer electrolyte preforms may reduce fragmentation and increase contact with the electrode.

Further, coating of the particles or composite electrolyte structure with an oxide or other ceramic, such as TiN, $Al_2O_3$, ZnO, $ZrO_2$, $CeO_2$, or Al doped ZnO, may improve the conductivity and circulation stability. The coating ALD formed $Al_2O_3$ film may improve the wetting of the interface. Similarly, ultra-thin LiPON film can be evenly applied to the surface of the particles through ALD, thereby reducing the interface contact resistance.

In various embodiments, the composite electrolyte structure 702 may include alternating layers of polymer electrolyte preforms 502 and ceramic electrolyte preforms 504 with a total number of electrolyte preforms 502 and 504 of two, three, four, five, six, seven, or more. In some embodiments, the polymer electrolyte preforms 502 form the outer layers of the composite electrolyte structure 702 to enhance the connectivity to electrodes. In these embodiments, an odd number of electrolyte preforms 502 and 504 may be included, such as three, five, seven, or more.

The bonding of the electrolyte preforms 502 and 504 is not limited to spark plasma sintering. In some embodiments, the bonding among the polymer electrolyte preforms and ceramic electrolyte preforms into a hybrid electrolyte structure is performed by microwave sintering (MWS) as schematically shown in FIG. 7B.

Figure 7B:
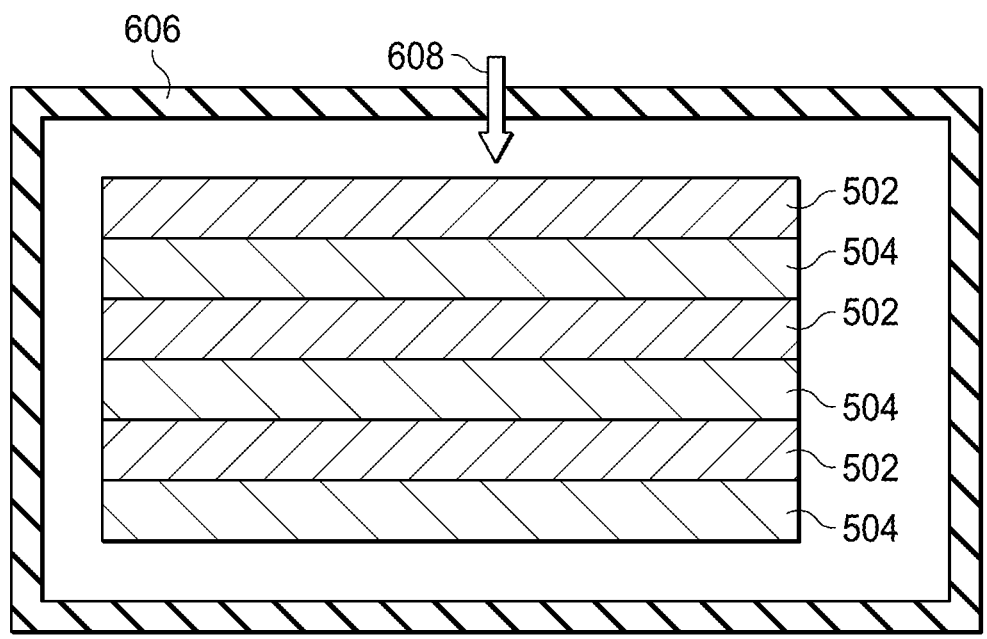
FIG. 7B is a schematic drawing of the bonding of alternating polymer electrolyte preforms and ceramic electrolyte preforms into a composite electrolyte structure using microwave sintering (MWS)

FIG. 7B is a schematic drawing of the bonding of alternating polymer electrolyte preforms 502 and ceramic electrolyte preforms 504 into a composite electrolyte structure 702 using microwave sintering (MWS). The stack of alternating electrolyte preforms 502 and 504 are placed in the microwave sintering chamber 606. Microwave energy is injected into the chamber through a microwave port 608. The heat is applied by triggering the interaction of the preforms and the electromagnetic energy in the frequency range of 300 MHz to 300 GHz. The localized heat among the particles in the preforms sinters them into the densified part.

Figure 7C:
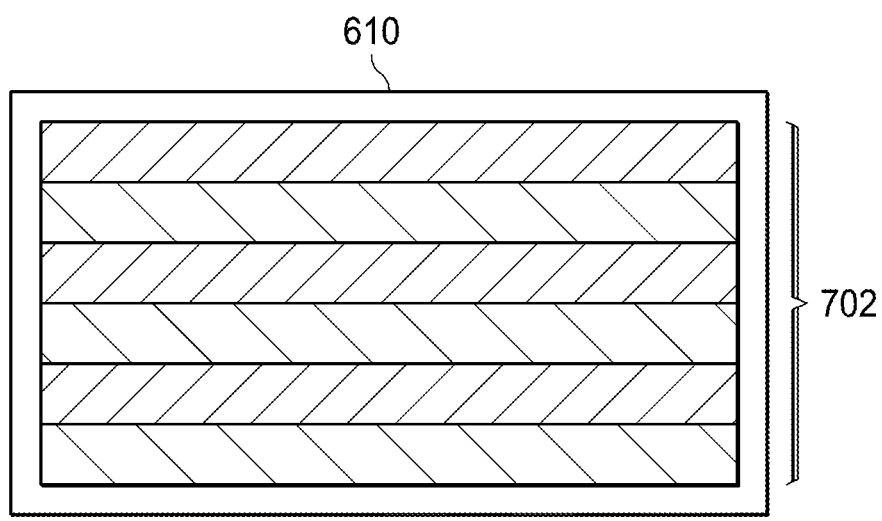
FIG. 7C is a schematic drawing of the composite electrolyte structure formed from both polymer electrolyte preforms and ceramic preforms after application of an oxide coating by atomic layer deposition.

FIG. 7C is a schematic drawing of the composite electrolyte structure 702 formed from both polymer electrolyte preforms 502 and ceramic preforms 504 after application of an oxide coating 610 by atomic layer deposition. As described herein, the coating process may be performed by sequential reaction of surface functional groups with precursor chemicals, as described herein. In various embodiments, the composite electrolyte structure 702 formed from the combination of the polymer electrolyte preforms 502 and the ceramic electrolyte preforms 504 is used in applications in which the temperature is greater than about 200° C.

An embodiment described herein provides a method for making an electrolyte for a high-temperature, high-pressure lithium ion battery. The method includes, coating polymer electrolyte particles with an oxide to make coated polymer electrolyte particles and printing a polymer electrolyte preform in a binder jet printer from the coated polymer electrolyte particles and a composite electrolyte structure is formed, at least in part from the polymer electrolyte preform.

In an aspect, the oxide on the polymer electrolyte particles is applied by atomic layer deposition. In an aspect, a number of polymer electrolyte preforms are bonded into the composite electrolyte structure by spark plasma sintering. In an aspect, a number of polymer electrolyte preforms are bonded into the composite electrolyte structure by microwave sintering.

In an aspect, the composite electrolyte structure is coated with the oxide. In an aspect, the oxide is supplied to the composite electrolyte structure by atomic layer deposition.

In an aspect, a ceramic electrolyte preform is printed in the binder jet printer from ceramic electrolyte particles. In an aspect, the composite electrolyte structure is formed by bonding alternating polymer electrolyte preforms and ceramic electrolyte preforms. In an aspect, the composite electrolyte structure is coated with the oxide. In an aspect, the oxide is supplied to the composite electrolyte structure by atomic layer deposition.

Another embodiment described herein provides a composite electrolyte structure. The composite electrolyte structure includes, at least in part, polymer electrolyte preforms that are bonded into the composite electrolyte structure.

In an aspect, the polymer electrolyte preforms include polymer electrolyte particles coated with an oxide. In an aspect, the polymer electrolyte particles comprise poly(vinylidene fluoride)-co-hexafluoropropylene (PVDF-HFP), or poly(ethyleneoxide) (PEO), poly (methylmethacrylate) (PMMA), polyacrylonitrile (PAN), or any combinations thereof. In an aspect, the oxide comprises $Al_2O_3$, $SiO_2$, $ZrO_2$, $Y_2O_3$, or any combinations thereof.

In an aspect, the polymer electrolyte preforms comprise a binder from a binder jet printer. In an aspect, the binder is removed during a bonding process by spark plasma sintering or microwave sintering. In an aspect, the composite electrolyte structure includes an oxide applied over the composite electrolyte structure.

In an aspect, the composite electrolyte structure includes ceramic electrolyte preforms that are bonded into the composite electrolyte structure with the polymer electrolyte preforms. In an aspect, the ceramic electrolyte preforms alternate with polymer electrolyte preforms. In an aspect, the ceramic electrolyte preforms comprise a binder from a binder jet printer. In an aspect, the binder is removed during a bonding process by spark plasma sintering or microwave sintering. In an aspect, the composite electrolyte structure includes an oxide coating applied over the composite electrolyte structure.

Other implementations are also within the scope of the following claims.

What is claimed is:

1. A composite electrolyte structure, comprising at least, in part, polymer electrolyte preforms that are bonded into the composite electrolyte structure,
wherein the polymer electrolyte preforms comprise polymer electrolyte particles coated with an oxide; and
wherein the composite electrolyte structure further comprises an oxide coating applied over the composite electrolyte structure, wherein the oxide coating applied over the composite electrolyte structure comprises $Al_2O_3$, ZnO, $ZrO_2$, $CeO_2$, or Al doped ZnO.

2. The composite electrolyte structure of claim 1, wherein the polymer electrolyte particles comprise poly(vinylidene fluoride)-co-hexafluoropropylene (PVDF-HFP), or poly(ethyleneoxide) (PEO), poly (methylmethacrylate) (PMMA), polyacrylonitrile (PAN), or any combinations thereof.

3. The composite electrolyte structure of claim 1, wherein the polymer electrolyte particles are coated with an oxide comprising $Al_2O_3$, $SiO_2$, $ZrO_2$, $Y_2O_3$, or any combinations thereof.

4. The composite electrolyte structure of claim 1, wherein the polymer electrolyte preforms comprise a binder from a binder jet printer.

5. The composite electrolyte structure of claim 4, wherein the binder is removed during a bonding process by spark plasma sintering.

6. The composite electrolyte structure of claim 1, comprising ceramic electrolyte preforms that are bonded into the composite electrolyte structure with the polymer electrolyte preforms.

7. The composite electrolyte structure of claim 6, wherein the ceramic electrolyte preforms alternate with polymer electrolyte preforms.

8. The composite electrolyte structure of claim 6, wherein the ceramic electrolyte preforms comprise a binder from a binder jet printer.

9. The composite electrolyte structure of claim 8, wherein the binder is removed during a bonding process by spark plasma sintering or microwave sintering.

10. The composite electrolyte structure of claim 1, wherein the oxide coating is applied over the composite electrolyte structure by atomic layer deposition.

11. The composite electrolyte structure of claim 4, wherein the binder is removed during a bonding process by microwave sintering.

12. The composite electrolyte structure of claim 1, wherein the polymer electrolyte preforms comprise between about 10 vol. % and about 40 vol. % binder and air.

13. The composite electrolyte structure of claim 1, wherein the polymer electrolyte preforms have a thickness between about 100 μm and about 700 μm.

14. The composite electrolyte structure of claim 1, wherein the polymer electrolyte particles have a diameter between about 20 μm and about 1000 μm.

15. The composite electrolyte structure of claim 1, wherein the polymer electrolyte particles are coated with an oxide having a thickness between about 1 nm and about 100 nm.

16. A composite electrolyte structure, comprising polymer electrolyte preforms that are bonded into the composite electrolyte structure,
wherein the polymer electrolyte preforms comprise polymer electrolyte particles coated with an oxide, and the polymer electrolyte preforms comprise between about 10 vol. % and about 40 vol. % binder and air; and
wherein the composite electrolyte structure further comprises an oxide coating applied over the composite electrolyte structure.

* * * * *